United States Patent [19]

Spenke et al.

[11] Patent Number: 4,737,834
[45] Date of Patent: Apr. 12, 1988

[54] THYRISTOR WITH CONTROLLABLE EMITTER SHORT-CIRCUIT PATHS INSERTED IN THE EMITTER

[75] Inventors: Eberhard Spenke, Pretzfeld; Hubert Patalong, Munich, both of Fed. Rep. of Germany

[73] Assignee: Siemens Aktiengesellschaft, Berlin and Munich, Fed. Rep. of Germany

[21] Appl. No.: 935,096

[22] Filed: Dec. 24, 1986

Related U.S. Application Data

[63] Continuation of Ser. No. 724,055, Apr. 18, 1985, abandoned, which is a continuation of Ser. No. 370,835, Apr. 22, 1982, abandoned.

[30] Foreign Application Priority Data

May 8, 1981 [DE] Fed. Rep. of Germany ....... 3118365

[51] Int. Cl.$^4$ ............................................. H21L 29/74
[52] U.S. Cl. ......................................... 357/38; 357/20; 357/30; 357/39; 357/23.4; 357/86

[58] Field of Search ..................... 357/23.4, 38, 39, 30, 357/20, 86

[56] References Cited

U.S. PATENT DOCUMENTS 3,387,358  6/1968  Heiman .............................. 357/23.4

Primary Examiner—Joseph E. Clawson, Jr.
Attorney, Agent, or Firm—Hill, Van Santen, Steadman & Simpson

[57] ABSTRACT

A thyristor has a plurality of gate-controlled MIS-FET structures which serve the purpose of controlling emitter short-circuit paths with the objective of achieving stabilization short-circuits and, if necessary, quenching short-circuits. MIS-FET structures are disclosed which are effective, yet make economical use of surface area. In accordance with the invention, this is achieved since structures are provided at a plurality of recesses of the layered n-type emitter such that the electrode contacting the n-type emitter has recesses permitting it to contact the MIS-FET structures only on a border side.

17 Claims, 6 Drawing Sheets

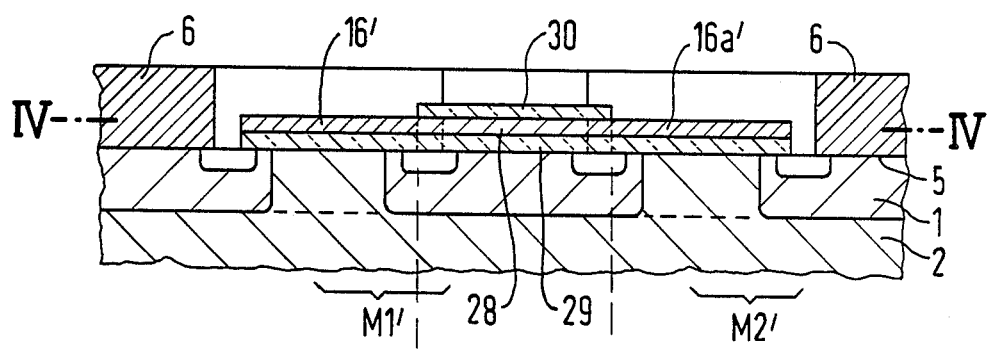
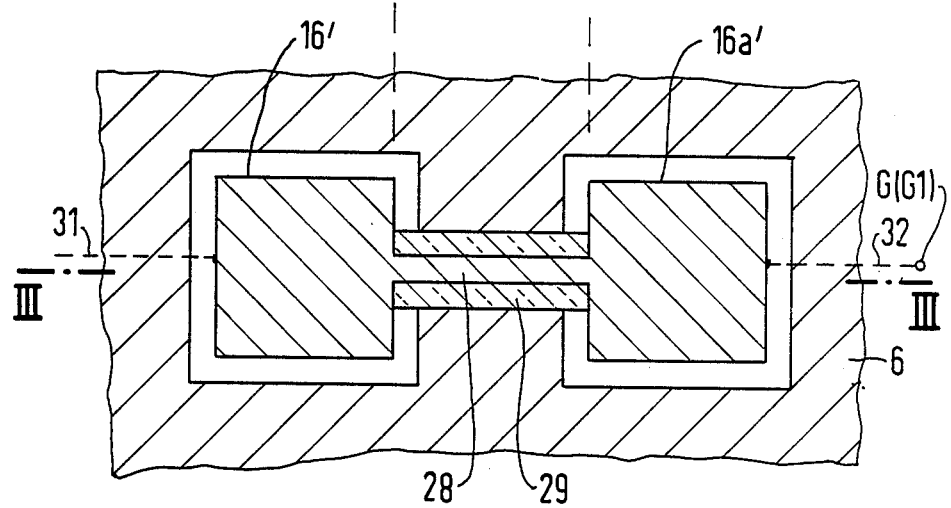

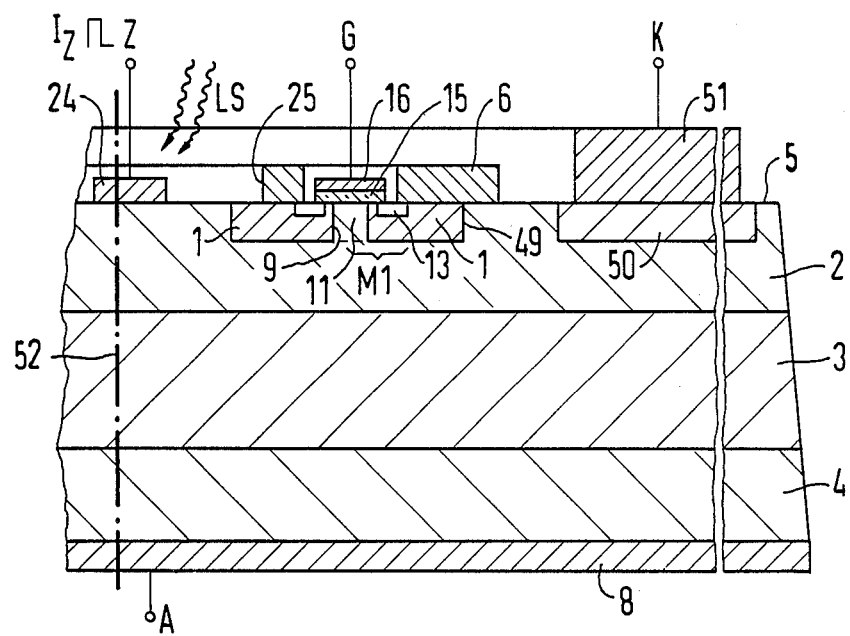
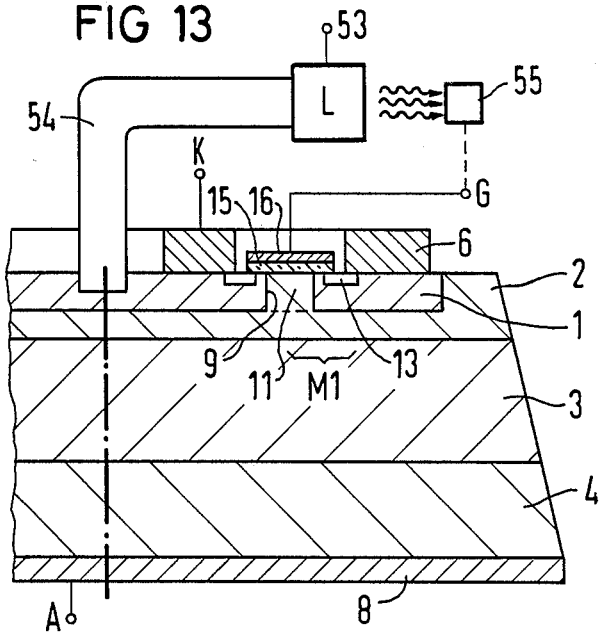

THYRISTOR WITH CONTROLLABLE EMITTER SHORT-CIRCUIT PATHS INSERTED IN THE EMITTER

This a continuation of application Ser. No. 724,055, filed Apr. 18, 1985, abandoned, which was a continuation of Ser. No. 370,835, filed 04-22-82, abandoned.

BACKGROUND OF THE INVENTION

The invention relates to a thyristor having MIS-FET structures arranged at a boundry surface of a four layer semiconductor member. The MIS-FET structures are arranged as controllable emitter short-circuit paths.

Thyristors of this type are known from U.S. Pat. No. 3,243,669, particularly FIG. 9, and from German Letters Pat. No. 26 25 917, both incorporated herein by reference. They exhibit MIS-FET structures which respectively consist of a first semiconductor zone of a first conductivity type connected with a first electrode of the thyristor. A second semiconductor zone of the first conductivity type is connected with a base layer bordering on the respective emitter. A semiconductor zone of the second conductivity type is disposed between the latter semiconductor zones, which semiconductor zones are covered by a gate electrically insulated with respect to the semiconductor member. Running over these structures are emitter short-circuit paths which are controllable via the gates of the structures. In U.S. Pat. No. 3,243,669, the emitter short-circuit paths are switched on merely for the purpose of quenching the thyristor. In German Letters Pat. No. 26 25 917, they are switched on for the purpose of quenching as well as during the supply of an ignition pulse in order to prevent an ignition of the thyristor.

Additional thyristors with controllable emitter short-circuit paths are described, for example, in the German patent applications Nos. P 29 45 366.5 and P 29 45 324.5, both incorporated herein by reference.

In order to effectively short-circuit the pn-junction between the emitter and the adjoining base layer it is advantageous in the case of the above-cited thyristors to design the controllable emitter short-circuit paths to be as large in surface area as possible. For this purpose, the emitter is divided into several emitter partial zones which are then respectively completely, or almost completely surrounded by MIS-FET structures. However, the particular portion of the thyristor cross-section which is allotted to the interstices between the individual emitter partial zones and to the MIS-FET structures cannot take over any load current fraction in the onstate of the thyristor.

SUMMARY OF THE INVENTION

An object underlying the invention is to provide a thyristor of the initially cited type which is provided with very effective, but surface or area economizing emitter short-circuit paths. This is achieved in accordance with the invention through a design of the thyristor wherein the n-type emitter has a plurality of apertures in which portions of the p-base layer are arranged and which extend to the boundry surface. Borders of the apertures in the n-type emitter are laterally surrounded by the first semiconductor zones of the MIS-FET structures. The borders of the apertures of the n-type emitter laterally surround a second semiconductor zone of the MIS-FET structures. The first electrode has apertures such that portions of the boundry surface laterally surrounded by the first semiconducter zones are isolated from contact in the first electrode.

One important advantage attainable with the invention is that the emitter short-circuit paths, in spite of their effectiveness, use a substantially smaller portion of the thyristor cross-section than is the case with the conventionally designed thyristors.

BRIEF DESCRIPTION OF THE DRAWINGS

FIG. 8 and FIG. 9 illustrate an additional partial circuit of FIG. 1;

FIG. 12 illustrates a third sample embodiment;

FIG. 13 illustrates a fourth sample embodiment; and

DESCRIPTION OF THE PREFERRED EMBODIMENTS

Figure 1:
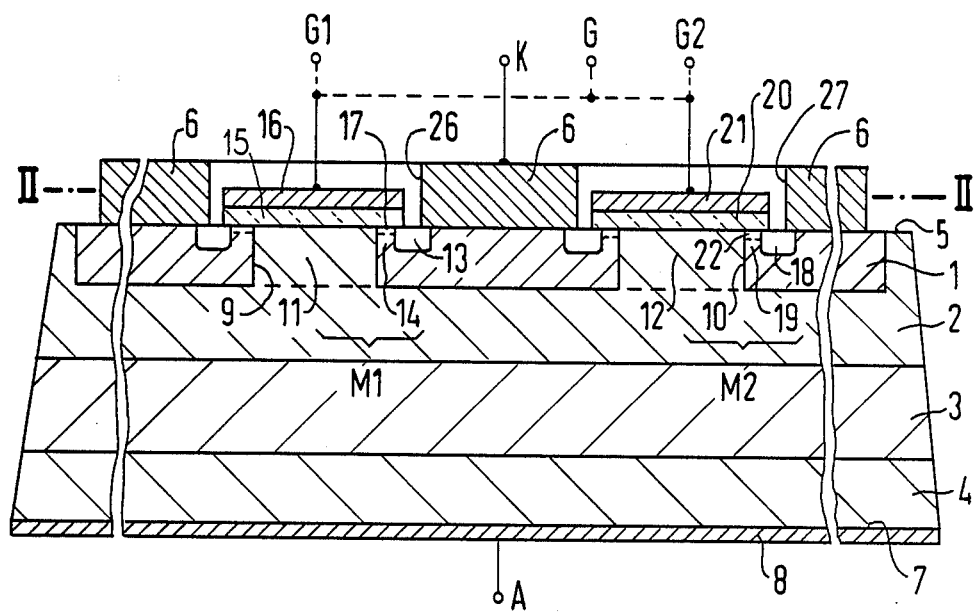
FIG. 1 illustrates in a side cross-sectional view along line I—I of FIG. 2 a preferred embodiment of the invention.

In FIG. 1 a thyristor with a semiconductor member, consisting of doped semiconductor material, for example silicon, is illustrated. The thyristor has four successive layers of alternating conductivity types. An n-conductive layer 1 is here designated as the n-emitter, a p-conductive layer 2 as the p-base layer, an n-conductive layer 3 as the n-base layer, and a p-conductive layer 4 as the p-emitter. The n-emitter 1 is covered on a boundary surface 5 of the semiconductor member with a first electrode (cathode) 6 of electrically conductive material, for example aluminum, which exhibits a connection terminal K. The p-emitter 4 is contacted, on the opposite boundary surface 7 of the semiconductor member, by a second electrode (anode) 8 of electrically conductive material, for example aluminum. The second electrode 8 is provided with a terminal connection A.

Figure 2:
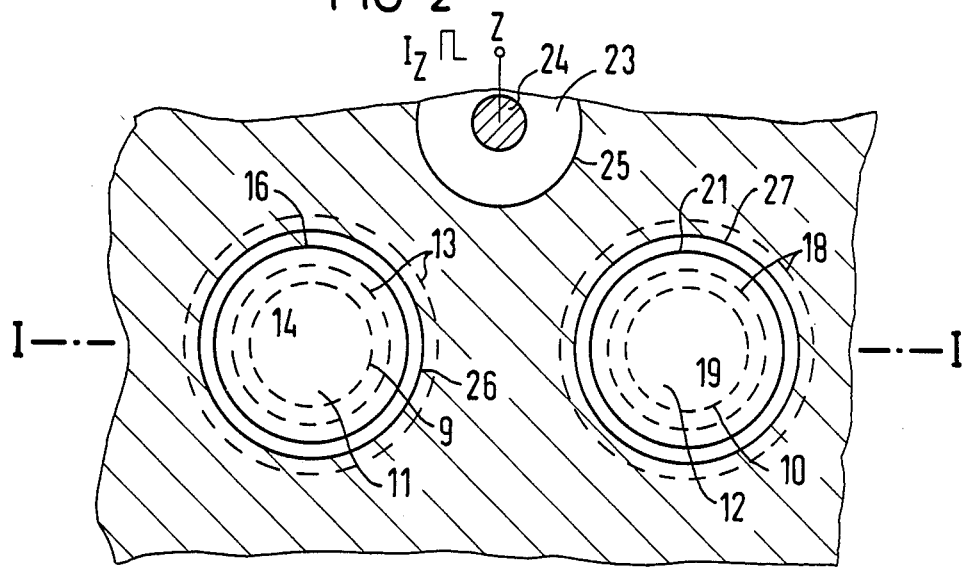
FIG. 2 illustrates by a top view along section line II—II of FIG. 1 a further representation of the preferred embodiment.

In the n-emitte 1, recesses 9 and 10 are provided the circular lateral limits of these recesses can be seen in FIG. 2, which shows a section through the thyristor in the plane II—II of FIG. 1. The apertures 9, 10 are penetrated by extension portions 11 and 12 of the p-base layer 2, which extend to the boundary surface 5. The aperture 9 is laterally surrounded by an annular p-conductive semiconductor zone 13 which is inserted in the n-emitter 1 and which extends to the boundary surface 5 of the semiconductor member. Between the interior border of the p-conductive semiconductor zone 13 and the section 11 of the p-base layer 2 there is disposed an annular boundary zone 14 of the n-emitter 1 which is covered by a thin electrically insulating layer 15 applied on the boundary surface 5. On layer 15 a gate 16 of electrically conductive material, for example aluminum, is applied, which is connected with a control terminal G. The parts 11, 13, 14, 15 and 16 form MIS-FET structures M1 of the depletion type, whereby 13 and 11 respectively represent first and second p-conductive semiconductor zones which are separated from one another by an n-conductive semiconductor zone consisting of the border zone 14. In the case of a voltage-free gate 16 in the portion of the border zone 14 immediately adjoining the boundary surface 5, a p-conductive channel 17 is present which interconnects the semiconductor zones 11 and 13 in a low-impedance fashion. Via the parts 11, 17, 13 and 6 an emitter short-circuit path runs which bridges the pn-junction between 1 and 2 in a low-impedance fashion. The channel 17 can relate either to an inversion channel which is brought about by an electric field prevailing on the boundary surface 5, or it can relate to a doped channel zone (metallurgical channel) which is inserted in the border zone 14 by means of a flat p-doping. If a positive voltage is supplied to the control terminal G, the channel 17 is eliminated or connected in a high-impedance fashion, so that the emitter short-circuit path is ineffective.

In the zone of the aperture 10 there are present, in analogous fashion, a p-conductive semiconductor zone 18, laterally surrounding said aperture 10, a border zone 19 of the n-emitter 1, an electrical insulating layer 20, a gate 21 connected with the control terminal G, and a channel 22 which, together with the extension-like portion 12 of the p-base layer 2, all form a MIS-FET structure M2 of the depletion type. Over the latter an emitter short-circuit path runs which consists of the parts 12, 22, 18 and 6.

Within a circular surface 23, the p-base layer 2 is covered neither by the n-emitter layer 1 nor by the first electrode 6, but extends to the boundary surface 5. It is there provided with an ignition electrode 24 which exhibits a terminal Z for an ignition current circuit.

The electrode 6 exhibits recesses 26 and 27, which are so dimensioned that the parts of the boundary surface 5, surrounded by the semiconductor zones 13 and 18, including the internal border zones of the semiconductor zones 13 and 18, are not contacted by the electrode 6. Since FIG. 1 shows a section of the thyristor in the plane I—I of FIG. 2, in FIG. 1 only the apertures 26 and 27 of the electrode 6 are recognizable, and not the aperture 25 for the ignition electrode. FIG. 2 shows only a part of the semiconductor member immediately surrounding the MIS structures M1 and M2 and the ignition electrode 24.

Figure 3:
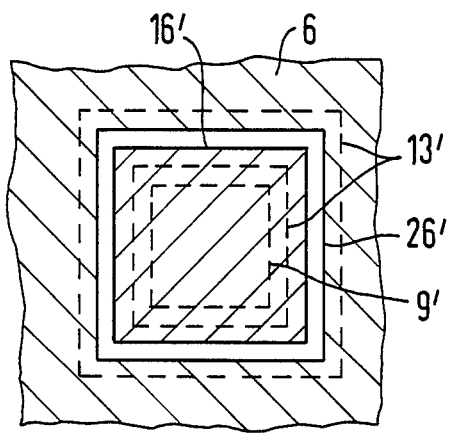
FIG. 3 illustrates a different embodiment of a partial circuit of FIG. 1.
Figure 4:
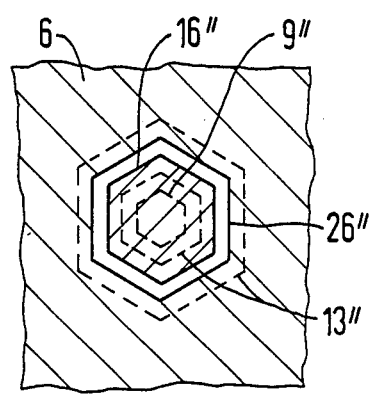
FIG. 4 illustrates an additional embodiment of the partial circuit of FIG. 1.

FIGS. 3 and 4 disclose alternative embodiments of a MIS-FET structure M1 or M2. In FIG. 3 a square aperture 9′ of the n-emitter 1 is illustrated which is surrounded by a correspondingly shaped n-conductive semiconductor zone 13′. The aperture 26′ of the electrode 6 and the gate 16′ are here likewise square shaped. FIG. 4 illustrates a hexagonal shape of the aperture 9′ and the adapted circuit parts 13″, 16″ and 26″, which correspond to the parts of FIG. 2 designated with the same numbers.

The thyristor according to FIG. 1 exhibits a plurality of MIS-FET structures M1, M2 ..., which are advantageously distributed as uniformly as possible over the cross-sectional surface; i.e., have distances from one another which are of as equal size as possible. According to a first circuit variant, the gates of all of these MIS-FET structures are connected with a first common control terminal G, such as illustrated in FIG. 1. In operation, the control terminal G is then released or connected prior to the ignition time of the voltages, respectively. The emitter short-circuit paths, for example 11, 17, 13, 6, are respectively switched on. A stability of the thyristor with respect to unintentional ignition operations is hereby guaranteed. The controllable emitter short-circuit paths of all structures in this case represent stability short-circuits.

For the ignition of the thyristor a positive ignition current pulse $I_z$ is supplied to the terminal Z, whereas simultaneously the control terminal G is subjected, for the duration of the ignition operation, to a positive voltage pulse which interrupts the p-channel 17, 22, etc., respectively, and hence switches off the stabilization short-circuits during the entire ignition operation.

Figure 5:
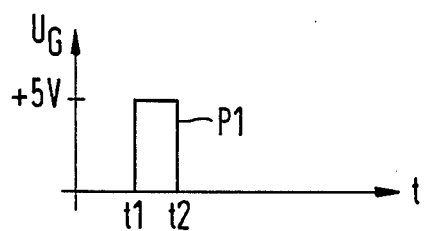
FIG. 5, FIG. 6, and FIG. 7 illustrate voltage-time diagrams for the purpose of explaining FIG. 1.

FIG. 5 illustrates the chronological progression of a control voltage $U_G$ which is supplied to the control terminal G in operation. As is apparent herefrom, G remains voltage-free except for a time interval t1 to t2 in which the ignition operation takes place. In this interval, a voltage pulse P1 of e.g. +5 V is connected. The ability to ignite the thyristor in the time interval t1 to t2 is thus substantially increased. After completed ignition, a load current of a load current circuit connected at A and K flows via the thyristor switched in low-impedance fashion. The disconnection of the latter is achieved through a disconnection of the voltage connected to A and K or, if it is a question here of an ac voltage, through the next-following zero crossing of the same.

Figure 6:
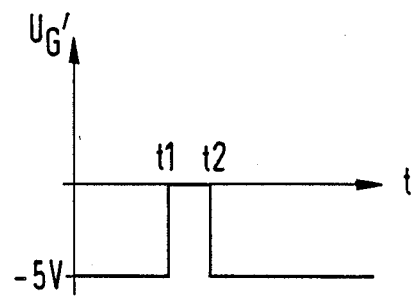

The positive voltage pulse P1 can be advantageously derived from the ignition voltage which, during supply of the ignition current pulse $I_z$, occurs at the terminal Z. For this purpose, the terminals Z and G are interconnected. If the MIS-FET structures M1, M2 ... are designed of the enhancement type, then there is supplied to the control terminal G a control voltage $U_G'$ whose time dependency is illustrated in FIG. 6. Subsequently, prior to the ignition time t1, i.e. in the blocking state of the thyristor, there is connected to the control terminal G a negative voltage of e.g. −5 V which brings about p-conductive inversion channels 17, 22, and thus renders the stabilization short-circuits effective. Only in the time interval t1 to t2, i.e. during the ignition operation, is the voltage $U_G'$ interrupted. The already-described method of operation is thus obtained.

Figure 7:
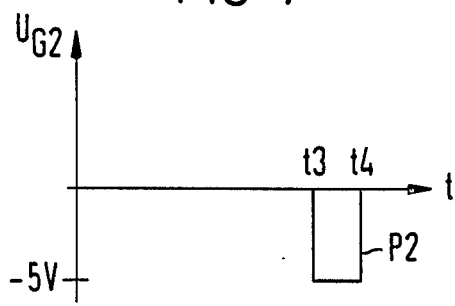

According to a second circuit variant of the thyristor according to FIG. 1, the gates of a first group of MIS-FET structures are connected with the control terminal G1, whereas the gates of a second group, which comprises a substantially larger number of such structures, are all wired with the control terminal G2. The second group can, for example, comprise 100 times as many MIS-FET structures than the first. The structures of the first group are here advantageously designed as such of the depletion type and are subjected to a control voltage $U_G$ according to FIG. 5, supplied to the control input G1, whereas the structures of the second group pertain to the enhancement type and, via G2, are subjected to a control voltage $U_{G2}$ whose time dependency is illustrated in FIG. 7. Subsequently, G2 is voltage-free in the blocking state of the thyristor during the ignition operation and in the ignited state, and is subjected to a negative pulse P2 with an amplitude of e.g. −5 V only during the quenching operation, i.e. in the time interval t3 and t4. The emitter short-circuit paths associated with this group then become effective and act as so-called quenching short-circuits; through them the defective electrons flooding the base layers 2 and 3 in the ignited state are shunted off to the cathode 6 as rapidly as possible.

FIGS. 8 and 9 illustrate a partial structure of the thyristor according to FIG. 1 which serves the purpose of providing a low-impedance connection of the gates of two adjacent MIS-FET structures. The sectional representations of FIGS. 8 and 9 correspond to the planes III—III and IV—IV, whereby in contrast to FIG. 2, the point of departure is the use of square-shaped structures according to FIG. 3. As is apparent from FIGS. 8 and 9, the gates 16' and 16a' of two MIS-FET structures M1' and M2' are interconnected via a printed conductor 28 consisting of an electrically conductive material, for example aluminum, which is separated from the boundary surface 5 by a thin, electrically insulating layer 29. The printed conductor 28 can be covered by an additional insulating layer 30. The remaining parts of FIGS. 8 and 9 correspond to the parts of FIGS. 1 and 2 provided with the same reference signs. A connection line 31, illustrated in broken lines, indicates that the gate 16' is connected, via an additional printed conductor, with the gate of an additional MIS-FET structure, in particular a structure of the same group. A line 32, illustrated in broken lines, indicates that the gate 16a' is connected, via another printed conductor, with one of the control terminals G or G1 or G2, respectively.

Figure 10:
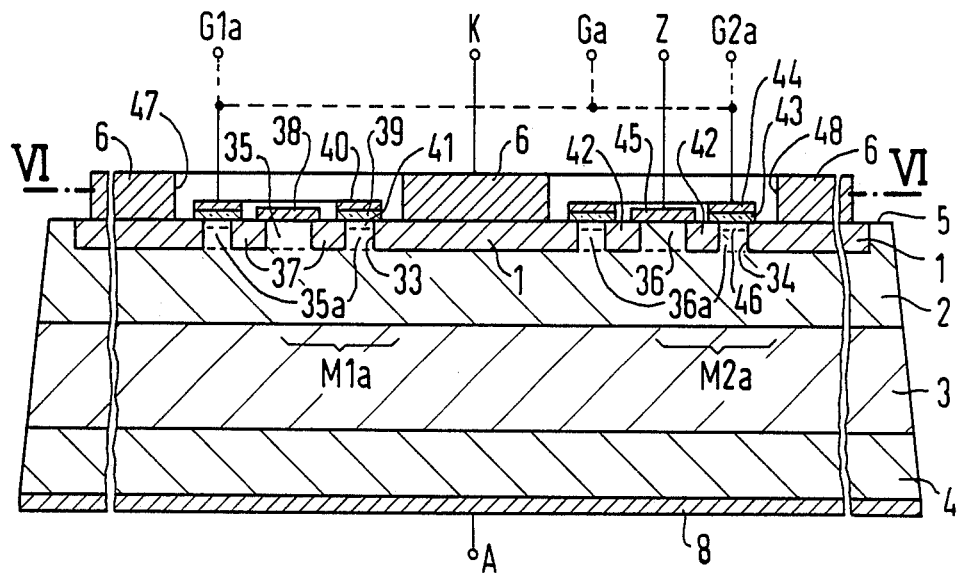
FIG. 10 illustrates a second sample embodiment of the invention.
Figure 11:
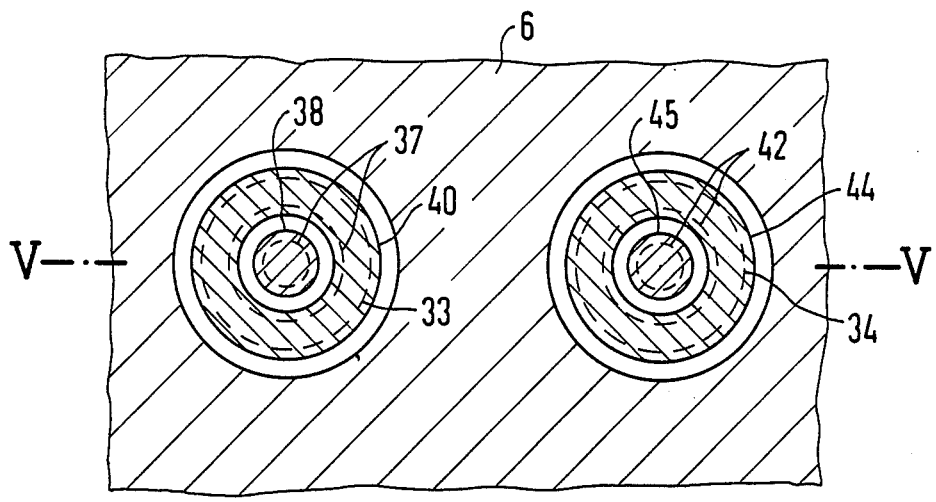
FIG. 11 illustrates a second representation of the sample embodiment.

FIGS. 10 and 11 show a second thyristor designed according to the invention, which again exhibits an n-emitter 1, a p-base layer 2, an n-base layer 3, and a p-emitter 4. The electrodes 6 and 8 correspond to the same designated electrodes of FIG. 1. FIG. 10 shows a section of the thyristor in the plane V—V of FIG. 11, whereas FIG. 11 represents a section of a part of the thyristor in the plane VI—VI of FIG. 10. In this sample embodiment, in the layered n-emitter 1, apertures 33 and 34 with circular lateral limits are provided which are penetrated by extension-like parts 35 and 36 of the p-base layer 2, which extend to the boundary surface 5. Inserted in the extension-like part 35 is an annular n-conductive zone 37 which extends to the boundary surface 5 of the semiconductor member. In the latter, it is contacted by a conductive coating 38 which also contacts the extension-like part 35, so that the pn-junction between the extension-like part 35 and the annular zone 37 is bridged in low-impedance fashion at the internal border of the latter. Between the border or edge of the aperture 33 and the exterior border of the n-conductive zone 37 there is disposed an annular border zone 35a of the extension-like part 35 of the p-base layer 2. The border zone 35a is covered by a thin, electrically insulating layer 39 applied on the boundary surface 5. On the latter layer 39 a gate 40 consisting of electrically conductive material, for example aluminum, is applied which is connected with a control terminal Ga.

The parts 1, 35a, 37, 39 and 40 form an MIS-FET structure M1a of the depletion type, whereby the zone of the n-emitter 1, bounding the aperture 33, and the annular zone 37 respectively represent a first and a second n-conductive semiconductor zone which are separated from one another by a p-conductive semiconductor zone consisting of the border zone 35a. In the case of a voltage-free gate 40, in the part of the border zone 35a directly adjoining the boundary surface 5, an n-conductive channel 41 is present which interconnects in a low-impedance fashion the semiconductor zones 1 and 37. Via the parts 38, 37 and 41, an emitter short-circuit path runs which bridges the pn-junction between 1 and 2 in a low-impedance fashion. The channel 41 relates to either an inversion channel, which is brought about by a field prevailing on the boundary surface 5, or it relates to a doped channel zone (metallurgical channel) which is inserted in 35a by means of a flat n-doping. If the control terminal Ga is wired with a negative voltage, then the channel 41 is eliminated or switched in a high-impedance fashion, so that the emitter short-circuit path 38, 37 and 41 is ineffective.

In an analogous fashion, at the right aperture 34, a MIS-FET structure M2a is formed which consists of an annular n-conductive zone 42, inserted in the attachment-like part 36, an annular border zone 36a of the attachment-like part 36, an insulating layer 43 covering the latter, and a gate 44. The gate 44 is likewise connected with the control terminal Ga. The pn-junction between the parts 36 and 42 is bridged in low-impedance fashion by a conductive coating 45. Via the structure M2a, pertaining to the depletion type, an emitter short-circuit path runs which consists of the parts 45, 42 and a channel 46 present in the border zone 36a in the case of a voltage-free gate 44. The channel 46 relates, as in the case of 41, to an inversion channel or to a doped channel which is formed by a flat n-doping on the boundary surface 5. The conductive coating 44 can be employed as an ignition electrode and is connected in this case with the terminal Z of the ignition current circuit.

Just like the MIS-FET structures M1 and M2, the structures M1a and M2a can also be square shaped, of hexagonal shape, or the like.

The electrode G is provided with apertures 47 and 48 which are so dimensioned that the boundary surface 5 in the zone of the apertures 33 and 34, including the zones of the n-emitter 1 bounding the latter, is not contacted.

For ignition of the thyristor according to FIG. 10, a positive ignition current pulse is supplied to the terminal Z. The activation of a plurality of MIS-FET structures M1a, M2a, etc., which are uniformly distributed over the thyristor cross-section, proceeds according to a first circuit variant via the one common control terminal Ga by use of a control voltage $-U_G$, which corresponds to the voltage according to FIG. 5, but which has an opposite sign. All emitter short-circuit paths then act as stabilization short-circuits. In the case of MIS-FET structures of the enhancement type, the same effect results if the activation proceeds by means of a voltage $U_G'$ according to FIG. 6 in reversing the sign. A second circuit variant provides a first group of MIS-FET structures of the depletion type; for example, M1a, etc. which are all connected with a control terminal G1a, and a second, substantially larger group of MIS-FET structures of the enhancement type; for example, M2a, etc., which are all connected with the control terminal G2a. In supplying a voltage UG (cf. FIG. 5) to G1a and $-U_{G2}$ (cf. FIG. 7) to G2a, the short-circuit paths of the first group act as stabilization short-circuits and the short-circuit paths of the second group act as quenching short-circuits.

FIG. 12 illustrates a sample embodiment of the invention in which the first electrode 6 does not, as in the case of the above-described thyristors, consist of a cathode, but of an auxiliary emitter electrode of a thyristor provided with internal current amplification. The electrode 6 here contacts an n-conducting auxiliary emitter 1 and, via its exterior border 49, is extended in the direction of an n-primary emitter 50. The n-primary emitter 50 is contacted by a cathode 51 which is connected with the terminal K. The second electrode 8 represents, as previously, the anode, and exhibits a terminal A. The thyristor according to FIG. 12 is, for example, rotationally symmetrically constructed relative to a symmetry axis 52.

A plurality of MIS-FET structures, of which only one is illustrated in FIG. 12, in a design according to FIG. 1 is subjected via a common control terminal G, with the voltage $U_G$ (in the case of structures of the depletion type), or to the voltage $U_G'$ (in the case of structures of the enhancement type). Their emitter short-circuit paths then act as stabilization short-circuits of the n-auxiliary emitter which are rendered ineffective during each ignition operation. Instead of an ignition by an ignition current pulse $I_z$ which is supplied to an ignition electrode 24, for example an ignition by means of light rays LS can also take place. In a region of the p-base layer 2 which is disposed beneath the recess 25 of the electrode 6, charge carriers are here produced through the light action, which charge carriers reach the boundary surface of the n-auxiliary emitter 1 and effect an emission of charge carriers from the n-auxiliary emitter into the base layers, as a consequence of which the ignition is initiated.

In the case of the light-ignitible thyristor according to FIG. 13, the radiation required for ignition is produced by a controllable light source L which is made to release a light pulse through an ignition current pulse supplied via a terminal 53. The latter is transmitted, via an optical guide 54, to the light-active zone of the thyristor. In FIG. 13, the n-emitter 1 represents the primary emitter of the thyristor. The electrode 6 is connected with the terminal K and forms the cathode. A plurality of MIS-FET structures, which are designed according to FIG. 1, are inserted in the primary emitter 1. In the case of the supply of a voltage $U_G$ or $U_G'$, respectively, to the terminal G, they again act as stabilization short-circuits. The voltage $U_G$ (FIG. 5) can advantageously be shunted off via an opto-electric transducer 55 which is in optical contact with the light source L.

Figure 14:
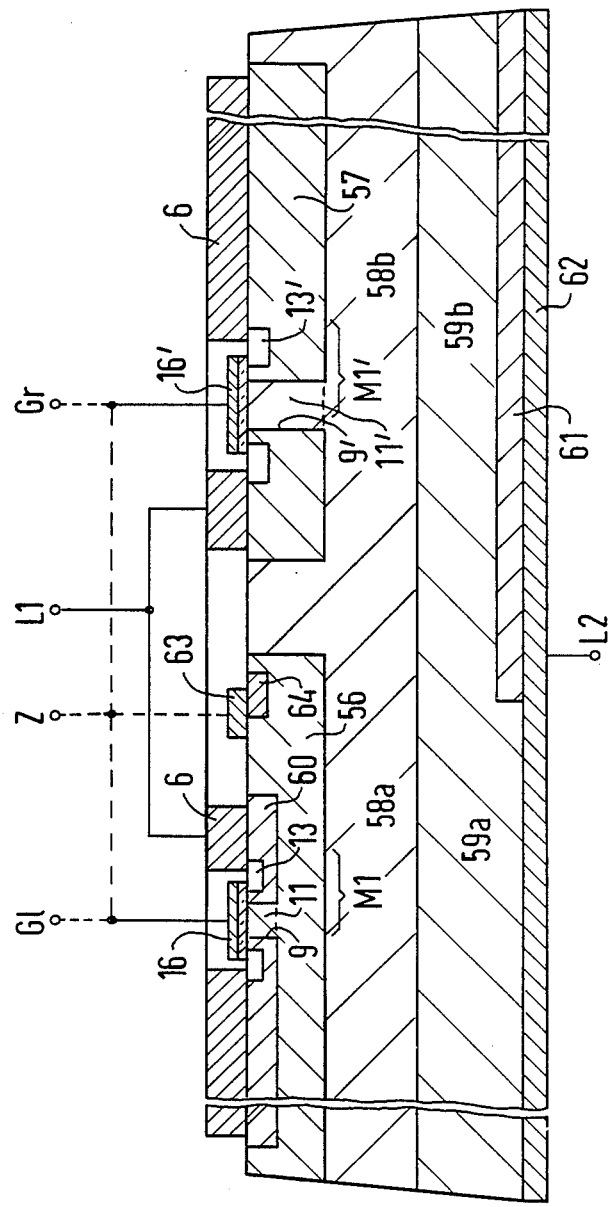
FIG. 14 illustrates a fifth sample embodiment of the invention.

In FIG. 14 a triac is illustrated which exhibits several successive conductor layers of alternating conductivity types. A first p-conductive layer forms the p-base layer 56 of a first transistor occupying the left-half of FIG. 14 as well as a p-emitter 57 of a second thyristor illustrated in the right-half of FIG. 14. An n-conductive layer bordering on 56 and 57 forms the n-base layers 58a and 58b of both thyristors, whereas the p-conductive layer disposed therebelow comprises the p-emitter 59a of the left thyristor and the p-base layer 59b of the right thyristor. Inserted in the p-base layer 56 is an n-emitter 60 of the first thyristor, whereas the n-emitter 61 of the second thyristor is inserted in the base layer 59b. The n-emitter 60 is contacted by a first electrode 6 which is provided with a terminal L1. The p-emitter of the right thyristor is likewise contacted by the first electrode 6. The p-emitter 59a and the n-emitter 61 are covered with a second electrode 62 which exhibits a terminal L2.

On the p-base layer 56 an ignition electrode 63 is provided. It contacts the p-base layer 56 as well as an n-conductive control zone 64 which is inserted in the layer 56. The ignition electrode 63 is connected with the terminal Z of an ignition current circuit.

Inserted in the n-emitter 60 of the left thyristor is a plurality of MIS-FET structures of the depletion type corresponding to FIG. 1, whose gates are connected with a control terminal G1. Inserted in the p-emitter 57 of the right thyristor is a plurality of MIS-FET structures M1'. The latter correspond to the structures M1, however with the difference that their semiconductor zones 57, 11', 13' exhibit the respectively opposite conductivity types with respect to the zones 60, 11, 13. The gate 16' of M1' is connected with the control terminal Gr. The MIS-FET structures are here preferably disposed in the boundary zone of both thyristors.

Connected to the terminals L1 and L2 in operation is an ac voltage. During a half-wave of the applied voltage, which connects L2 to a more positive potential than L1, the left thyristor ignites with supply of a positive ignition current pulse via Z and with an activation of G1 with a positive pulse during the ignition operation (FIG. 5). In the next-following half-wave, the right thyristor then ignites with supply of a negative ignition current pulse via G and with an activation of Gr with a negative pulse during the ignition operation. The activation of G1 and Gr can proceed with the aid of the ignition voltage occurring at Z if both terminals are connected with Z. The MIS-FET structures M1 and M1' act as stabilization short-circuits and render possible an operation of the triac with high commutation dU/dt values.

The effect of controllable emitter short-circuit paths in the case of thyristors corresponding to the FIGS. 12 through 14 is described in detail in the German patent application Nos. P 29 45 347.2, P 29 45 335.8 and P 29 45 380.3, all incorporated herein by reference.

Although various minor modifications may be suggested by those versed in the art, it should be understood that I wish to embody within the scope of the patent warranted hereon, all such embodiments as reasonably and properly come within the scope of my contribution to the art.

I claim as my invention:

1. A thyristor, comprising:
a semiconductor member having a boundary surface and formed of an n-type emitter contacted by a first electrode, an adjoining p-type base layer, an adjoining n-type base layer, and a p-type emitter contacted by a second electrode;
MIS-FET structures arranged at the boundary surface of the semiconductor member, said MIS-FET structures being arranged as controllable emitter short-circuit paths;
said MIS-FET structures each comprising a first semiconductor zone of p-conductivity type connected with the first electrode and disposed in the n-type emitter, a second semiconductor zone of p-conductivity type comprising an extension of the base layer, and a semiconductor zone of n-conductivity type formed by border zones of the n-type emitter disposed between the first and second zones and which is covered by a gate electrode electrically insulated relative to the semiconductor member;
the n-type emitter having a plurality of apertures in which the extensions of the p-type base layer are arranged and which extend to the boundary surface;
borders of the apertures in the n-type emitter being completely laterally surrounded by the first semiconductor zones of the MIS-FET structures;
the borders of the apertures in the n-type emitter completely laterally surrounding the second semiconductor zones; and
the first electrode having apertures such that portions of the boundary surface laterally surrounded by the first semiconductor zones and the gate electrode are isolated from contacting the first electrode, and the first electrode apertures completely laterally surrounding the gate electrode.

2. A thyristor according to claim 1 wherein lateral borders of the apertures of the n-type emitter have a circular shape.

3. A thyristor according to claim 1 wherein lateral borders of the apertures of the n-type emitter have a square shape.

4. A thyristor according to claim 1 wherein lateral borders of the apertures of the n-type emitter have a hexagonal shape.

5. A thyristor according to claim 1 wherein the first electrode is an auxiliary emitter electrode.

6. A thyristor according to claim 1 wherein the first electrode is a cathode and the second electrode is an anode.

7. A thyristor according to claim 1 wherein the MIS-FET structures are arranged in apertures of the n-type emitter which are adjacent a light-active zone in its base layer.

8. A triac, comprising:
first and second thyristors formed in a semiconductor member having a boundary surface;
the first thyristor being formed of:
an n-type emitter contacted by a first electrode, an adjoining p-type base layer, an adjoining n-type base layer, and a p-type emitter contacted by a second electrode;
MIS-FET structures arranged at the boundary surface of the semiconductor member, said MIS-FET structures being arranged as controllable emitter short-circuit paths;
said MIS-FET structures each comprising a first semiconductor zone of p-conductivity type connected with the first electrode and disposed in the n-type emitter, a second semiconductor zone of p-conductivity type comprising an extension of the base layer, and a semiconductor zone of n-conductivity type formed by border zones of the n-type emitter disposed between the first and second zones and which is covered by a gate electrode electrically insulated relative to the semiconductor member;
the n-type emitter having a plurality of apertures in which the extensions of the p-type base layer are arranged and which extend to the boundary surface;
borders of the apertures in the n-type emitter being completely laterally surrounded by the first semiconductor zones of the MIS-FET structures;
the borders of the apertures in the n-type emitter completely laterally surrounding the second semiconductor zones;
the first electrode having apertures such that portions of the boundary surface laterally surrounded by the first semiconductor zones and the gate electrode are isolated from contacting the first electrode, and the first electrode apertures completely laterally surrounding the gate electrode;
the second thyristor being formed of:
an n-type emitter contacted by the second electrode, an adjoining p-type base layer, an adjoining n-type base layer, and a p-type emitter contacted by the first electrode;
MIS-FET structures arranged at the boundary surface of the semiconductor member, said MIS-FET structures being arranged as controllable emitter short-circuit paths;
said MIS-FET structures each comprising a first semiconductor zone of n-conductivity type connected with the first electrode and disposed in the p-type emitter, a second semiconductor zone of n-conductivity type comprising an extension of the n-type base layer, and a semiconductor zone of p-conductivity type formed by border zones of the p-type emitter disposed between the first and second zones and which is covered by a gate electrode electrically insulated relative to the semiconductor member;
the p-type emitter having a plurality of apertures in which the extensions of the n-type base layer are arranged and which extend to the boundary surface;
borders of the apertures in the p-type emitter being completely laterally surrounded by the first semiconductor zones of the MIS-FET structures;
the borders of the apertures in the p-type emitter completely laterally surrounding the second semiconductor zones; and
the first electrode having apertures such that portions of the boundary surface laterally surrounded by the first semiconductor zones and the gate electrode are isolated from contacting the first electrode, and the first electrode apertures completely laterally surrounding the gate electrode.

9. A thyristor, comprising:
a semiconductor member having a boundary surface and formed of an n-type emitter contacted by a first electrode, an adjoining p-type base layer, an adjoining n-type base layer, and a p-type emitter contacted by a second electrode;
MIS-FET structures arranged at the boundary surface of the semiconductor member, said MIS-FET structures being arranged as controllable emitter short-circuit paths;
said MIS-FET structures each comprising a first semiconductor zone of n-conductivity type connected with the second electrode and disposed in the p-type emitter, a second semiconductor zone of n-conductivity type comprising an extension of the n-type base layer, and a semiconductor zone of p-conductivity type formed by border zones of the p-type emitter disposed between the first and second zones and which is covered by a gate electrode electrically insulated relative to the semiconductor member;
the p-type emitter having a plurality of apertures in which the extensions of the n-type base layer are arranged and which extend to the boundary surface;
borders of the apertures in the p-type emitter being completely laterally surrounded by the first semiconductor zones of the MIS-FET structures;
the borders of the apertures in the p-type emitter completely laterally surrounding the second semiconductor zones; and
the second electrode having apertures such that portions of the boundary surface laterally surrounded by the first semiconductor zones and the gate electrode are isolated from contacting the second electrode, and the second electrode apertures completely laterally surrounding the gate electrode.

10. A thyristor according to claim 9 wherein lateral borders of the apertures of the p-type emitter have a circular shape.

11. A thyristor according to claim 9 wherein lateral borders of the apertures in the p-type emitter have a square shape.

12. A thyristor according to claim 9 wherein lateral borders of the apertures of the p-type emitter have a hexagonal shape.

13. A thyristor according to claim 9 wherein the second electrode is an auxiliary emitter electrode.

14. A thyristor according to claim 9 wherein the first electrode is a cathode and the second electrode is an anode.

15. A thyristor according to claim 9 wherein the MIS-FET structures are arranged in apertures of the p-type emitter which are adjacent a light-active zone in its base layer.

16. A thyristor, comprising:
a semiconductor member having a boundary surface and formed of an n-type emitter contacted by a first electrode, an adjoining p-type base layer, an adjoining n-type base layer, and a p-type emitter contacted by a second electrode;
MIS-FET structures arranged at the boundary surface of the semiconductor member, said MIS-FET structures being arranged as controllable emitter short-circuit paths;
said MIS-FET structures each comprising a first semiconductor zone of p-conductivity type connected with the first electrode and disposed in the n-type emitter, a second semiconductor zone of p-conductivity type comprising an extension of the base layer, and a semiconductor zone of n-conductivity type formed by border zones of the n-type emitter disposed between the first and second zones and which is covered by a gate electrode electrically insulated relative to the semiconductor member;
the n-type emitter having a plurality of apertures in which the extensions of the p-type base layer are arranged and which extend to the boundary surface;
borders of the apertures in the n-type emitter being completely laterally surrounded by the first semiconductor zones of the MIS-FET structures;
the borders of the apertures in the n-type emitter completely laterally surrounding the second semiconductor zones;
the first electrode having pairs of apertures connected by a cut-out region therebetween such that portions of the boundary surface laterally surrounded by the first semiconductor zones and the gate electrode in each aperture are isolated from contacting the first electrode, the first electrode apertures completely laterally surrounding the gate electrode except for said cut-out region, and the two gate electrodes in the pair of apertures being conductively interconnected through said cut-out region.

17. A thyristor, comprising:
a semiconductor member having a boundary surface and formed of an n-type emitter contacted by a first electrode, an adjoining p-type base layer, an adjoining n-type base layer, and a p-type emitter contacted by a second electrode;
MIS-FET structures arranged at the boundary surface of the semiconductor member, said MIS-FET structures being arranged as controllable emitter short-circuit paths;
said MIS-FET structures each comprising a first semiconductor zone of n-conductivity type connected with the first electrode and disposed in the p-type emitter, a second semiconductor zone of n-conductivity type comprising an extension of the base layer, and a semiconductor zone of p-conductivity type formed by border zones of the p-type emitter disposed between the first and second zones and which is covered by a gate electrode electrically insulated relative to the semiconductor member;
the p-type emitter having a plurality of apertures in which the extensions of the n-type base layer are arranged and which extend to the boundary surface; borders of the apertures in the p-type emitter being completely laterally surrounded by the first semiconductor zones of the MIS-FET structures;
the borders of the apertures in the p-type emitter completely laterally surrounding the second semiconductor zones;
the second electrode having pairs of apertures connected by a cut-out region therebetween such that portions of the boundary surface laterally surrounded by the first semiconductor zones and the gate electrode in each aperture are isolated from contacting the first electrode, the second electrode apertures completely laterally surrounding the gate electrode except for said cut-out region, and the two gate electrodes in the pair of apertures being conductively interconnected through said cut-out region.

* * * * *